(12) United States Patent
Lee

(10) Patent No.: US 7,488,983 B2
(45) Date of Patent: Feb. 10, 2009

(54) TRANSFLECTIVE LIQUID CRYSTAL DISPLAY DEVICE AND METHOD OF FABRICATING THE SAME

(75) Inventor: Jung Il Lee, Seoul (KR)

(73) Assignee: LG Display Co., Ltd., Seoul (KR)

(*) Notice: Subject to any disclaimer, the term of this patent is extended or adjusted under 35 U.S.C. 154(b) by 298 days.

(21) Appl. No.: 11/372,068

(22) Filed: Mar. 10, 2006

(65) Prior Publication Data

US 2007/0057260 A1 Mar. 15, 2007

(30) Foreign Application Priority Data

Sep. 13, 2005 (KR) .................. 10-2005-0085036

(51) Int. Cl.
*H01L 27/14* (2006.01)
(52) U.S. Cl. .................. 257/72; 257/E33.064
(58) Field of Classification Search .......... 257/758, 257/759, 59, 72
See application file for complete search history.

(56) References Cited

U.S. PATENT DOCUMENTS 6,620,655 B2 * 9/2003 Ha et al. ............. 438/149
6,654,076 B2 * 11/2003 Ha et al. ............. 349/43
2004/0021813 A1 * 2/2004 Kim et al. ............. 349/113

FOREIGN PATENT DOCUMENTS

CN 1573480 A 2/2005

* cited by examiner

*Primary Examiner*—Wai-Sing Louie
*Assistant Examiner*—Bilkis Jahan
(74) *Attorney, Agent, or Firm*—Holland & Knight LLP

(57) ABSTRACT

An array substrate for a transflective liquid crystal display device includes: a substrate; a gate line and a data line on the substrate, the gate line and the data line crossing each other to define a pixel region including a transmissive area and a reflective area surrounding the transmissive area; a thin film transistor having a gate insulating layer, the thin film transistor connected to the gate line and the data line; a first passivation layer on the thin film transistor, the first passivation layer having a drain contact hole exposing a drain electrode of the thin film transistor and a through hole exposing the substrate in the transmissive area; a reflective plate on the first passivation layer; a second passivation layer on the reflective plate; and a pixel electrode on the second passivation layer, the pixel electrode contacting the substrate in the transmissive area through the through hole and contacting the drain electrode through the drain contact hole.

11 Claims, 17 Drawing Sheets

TRANSFLECTIVE LIQUID CRYSTAL DISPLAY DEVICE AND METHOD OF FABRICATING THE SAME

This application claims the benefit of Korean Patent Application No. 2005-0085036, filed on Sep. 13, 2005, which is hereby incorporated by reference in its entirety.

BACKGROUND OF THE INVENTION

1. Field of the Invention

The present invention relates to a liquid crystal display (LCD) device and a method of fabricating a liquid crystal display device, and more particularly, to an array substrate for a transflective liquid crystal display device and a method of fabricating the same.

2. Discussion of the Related Art

As the information age advances, display devices for displaying information are actively being developed. More particularly, flat panel display (FPD) devices having a thin profile, light weight and low power consumption are actively being pursued. FPD devices can be classified as either an emissive type or a non-emissive type depending on their light emission capability. In an emissive type FPD device, an image is displayed using light that emanates from the FPD device. In a non-emissive type FPD device, an image is displayed using light from an external source that reflects and/or transmits through the FPD. For example, a plasma display panel (PDP) device is a field emission display (FED) device. In another example, an electroluminescent display (ELD) device is an emissive type FPD device. Unlike a PDP and an ELD, a liquid crystal display (LCD) device is a non-emissive type FPD device that uses light from a backlight.

Among the various types of FPD devices, liquid crystal display (LCD) devices are widely used as monitors for notebook computers and desktop computers because of their high resolution, color rendering capability and superiority in displaying moving images. The LCD device displays images by controlling a transmittance of light through the device. More particularly, liquid crystal molecules of a liquid crystal interposed between two substrates facing each other control light transmission in response to an electric field generated between electrodes on at least one of the substrates.

Because the LCD device does not emit a light, the LCD device needs to be used with a light source. Thus, a backlight is disposed on the rear surface on a liquid crystal panel of the LCD device, and images are displayed with a light emitted from the backlight and transmitted through the liquid crystal panel. Accordingly, the above-mentioned LCD device is referred to as a transmission type LCD device. The transmission type LCD device can display bright images in a dark environment due to the use of a separate light source, such as a backlight, but may have a large power consumption because of the use of the backlight.

To solve the problem of large power consumption, a reflection type LCD device has been developed. The reflection type LCD device controls a transmittance of light by reflecting an outside natural light or artificial light through a liquid crystal layer. In a reflection type LCD device, a pixel electrode on a lower substrate is formed of a conductive material having a relatively high reflectance and a common electrode on an upper substrate is formed of a transparent conductive material. Although the reflection type LCD device may have lower power consumption than the transmission type LCD device, it may have low brightness when the outside light is insufficient or weak.

To solve both the problems of large power consumption and low brightness, a transflective LCD device combining the capabilities of a transmission type LCD device and reflection type LCD device has been suggested. The transflective LCD device can select a transmission mode using a backlight while in an indoor environment or a circumstance having no external light source, and a reflection mode using an external light source in an environment where the external light source exists.

FIG. 1 is a cross-sectional view of an array substrate for a transflective LCD device according to the related art. In FIG. 1, a substrate 10 includes a pixel region "P" defined by a crossing of a gate line (not shown) and a data line 30. The pixel region "P" includes a reflective area "RA" and a transmissive area "TA." The reflective area "RA" includes a transistor area "TrA."

A thin film transistor (TFT) "Tr," including a gate electrode 15, a gate insulating layer 20, a semiconductor layer 25, a source electrode 33 and a drain electrode 36, is formed on the substrate 10 in the transistor area "TrA." The semiconductor layer 25 includes an active layer 25a and an ohmic contact layer 25b. A first passivation layer 39 of an inorganic insulating material is formed on the TFT "Tr" and a second passivation layer 45 of an organic insulating material is formed on the first passivation layer 39. Subsequently, a through hole "TH" is formed in the second passivation layer 45 within the transmissive area "TA." Further, the second passivation layer 45 includes a drain contact hole 47 exposing the drain electrode 36 and an uneven top surface. A third passivation layer 49 of an inorganic insulating material is formed on the second passivation layer 45 and has the drain contact hole 47 exposing the drain electrode 36. A reflective plate 52 of a reflective metallic material is formed on the third passivation layer 49. The reflective plates 52 in the adjacent pixel region "P" are separated from each other. A fourth passivation layer 55 of an inorganic insulating material is formed on the reflective plate 52, and a pixel electrode 60 is formed on the fourth passivation layer 55. The pixel electrode 60 is connected to the drain electrode 36 through the drain contact hole 47. As a result, the gate insulating layer 20 of the thin film transistor (TFT) "Tr,", the first passivation layer 39, the third passivation layer 49, the fourth passivation layer 55 and the pixel electrode 60 are sequentially formed on the substrate 10 in the transmissive area "TA."

FIGS. 2A to 2F are cross-sectional views showing a fabrication process of an array substrate for a transflective LCD device according to the related art. As shown in FIG. 2A, after a first metal layer (not shown) of a first metallic material is deposited on a substrate 10, a gate electrode 15 and a gate line (not shown) are formed by patterning the first metal layer through a first mask process including a coating step for a photoresist (PR), an exposure step using a mask, a developing step of the PR and an etching step of the first metal layer. The substrate 10 includes a pixel region "P" divided into a transmissive area "TA" and a reflective area "RA." The reflective area "RA" includes a transistor area "TrA."

As shown in FIG. 2B, a gate insulating layer 20 is formed on the gate electrode 15 and the gate line. An intrinsic amorphous silicon layer (not shown), a doped amorphous silicon layer (not shown) and a second metal layer (not shown) are sequentially deposited on the gate insulating layer 20. Then, a data line 30, a semiconductor layer 25, including an active layer 25a and an ohmic contact layer 25b, a source electrode 33 and a drain electrode 36, are formed by patterning the second metal layer, the doped amorphous silicon layer and the intrinsic amorphous silicon layer through a second mask process.

As shown in FIG. 2C, a first passivation layer 39 is formed on the source electrode 33, the drain electrode 36 and the data line 30 by depositing an inorganic insulating material. After coating an organic insulating material on the first passivation layer 39, a second passivation layer 45 is formed by patterning the coated organic insulating material through a third mask process. The second passivation layer 45 has an uneven top surface, and includes a drain contact hole 47 and a through hole "TH." The drain contact hole exposes the first passivation layer 39 on the drain electrode 36 and the through hole "TH" exposes the first passivation layer 39 in the transmissive area "TA." In addition, a third passivation layer 49 is formed on the second passivation layer 39 by depositing an inorganic insulating material.

As shown in FIG. 2D, after a third metal layer (not shown) having a reflectance is deposited on the third passivation layer 49, a reflective plate 52 is formed in the reflective area "RA" of the pixel region "P" by patterning the third metal layer through a fourth mask process. Since the third metal layer corresponding to the drain contact hole 47 and the through hole "TH" is removed, the third passivation layer 49 corresponding to the drain contact hole 47 and the through hole "TH" is exposed through the reflective plate 52.

As shown in FIG. 2E, after an inorganic insulating material is deposited on the reflective plate 52, a fourth passivation layer 55 is formed by patterning the deposited inorganic insulating material through a fifth mask process. Since the fourth passivation layer 55, the third passivation layer 49 and the first passivation layer 39 corresponding to the drain contact hole 47 are removed, the drain electrode 36 is exposed through the drain contact hole 47.

As shown in FIG. 2F, after a transparent conductive material is deposited on the fourth passivation layer 55. Then, a pixel electrode 60 is formed in the pixel region "P" by patterning the deposited transparent conductive material through a sixth mask process. Thus, the pixel electrode 60 is connected to the drain electrode 36 through the drain contact hole 47.

As described above, an array substrate for a transflective LCD device according to the related art is fabricated through a six-mask process. Each mask process includes several steps, such as coating PR, exposure of the PR using a mask, a developing the PR, etching using the developed PR and stripping the developed PR. Accordingly, mask processes are expensive in terms of both fabrication time and material cost. In addition, each mask process introduces an additional probability of yield reduction.

SUMMARY OF THE INVENTION

Accordingly, the present invention is directed to a transflective LCD device and a method of fabricating the same that substantially obviate one or more of the problems due to limitations and disadvantages of the related art.

An object of the present invention is to provide an array substrate for a transflective LCD device that is fabricated through a five-mask process, and a method of fabricating the same.

Another object of the present invention is to provide an array substrate for a transflective LCD device having an improved production efficiency, and a method of fabricating the same.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, an array substrate for a transflective liquid crystal display device includes: a substrate; a gate line and a data line on the substrate, the gate line and the data line crossing each other to define a pixel region including a transmissive area and a reflective area surrounding the transmissive area; a thin film transistor having a gate insulating layer, the thin film transistor connected to the gate line and the data line; a first passivation layer on the thin film transistor, the first passivation layer having a drain contact hole exposing a drain electrode of the thin film transistor and a through hole exposing the substrate in the transmissive area; a reflective plate on the first passivation layer; a second passivation layer on the reflective plate; and a pixel electrode on the second passivation layer, the pixel electrode contacting the substrate in the transmissive area through the through hole and contacting the drain electrode through the drain contact hole.

In another aspect, a method of fabricating an array substrate for a transflective liquid crystal display device includes: forming a gate line and a data line on a substrate, the gate line and the data line crossing each other to define a pixel region including a transmissive area and a reflective area surrounding the transmissive area; forming a gate insulating layer between the gate line and the data line; forming a thin film transistor connected to the gate line and the data line; forming a first passivation layer on the thin film transistor, the first passivation layer having a drain contact hole exposing a drain electrode of the thin film transistor and a through hole exposing the gate insulating layer on the substrate in the transmissive area; sequentially forming a first metal layer, a first inorganic insulating material layer and a first photoresist pattern on the first passivation layer etching the first metal layer, the first inorganic insulating material layer and the gate insulating layer using the first photoresist pattern as an etch mask to form a reflective plate and a second passivation layer on the reflective plate and to expose the drain electrode through the drain contact hole and the substrate through the through hole; and forming a pixel electrode on the second passivation layer, the pixel electrode contacting the drain electrode through the drain contact hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiments of the present invention, examples of which are illustrated in the accompanying drawings. Wherever possible, similar reference numbers will be used to refer to the same or similar parts.

Figure 1:
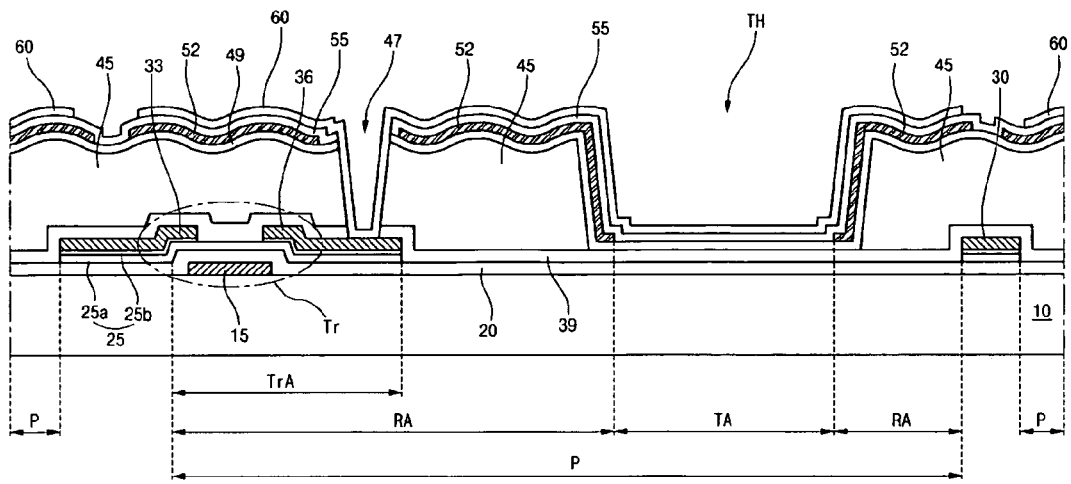
FIG. 1 is a cross-sectional view of an array substrate for a transflective LCD device according to the related art.
Figure 2A:
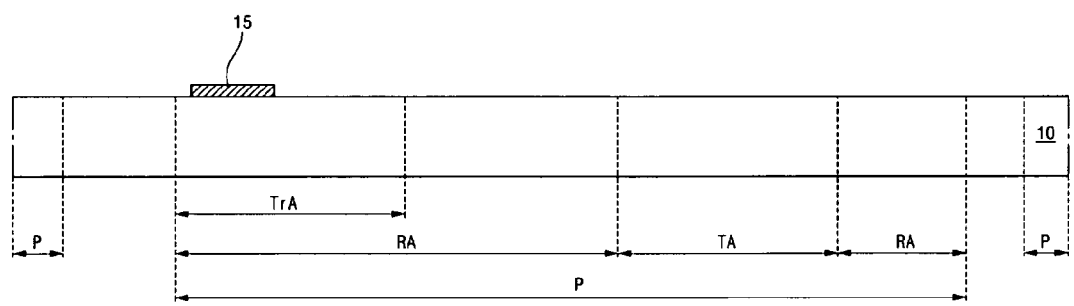
FIGS. 2A to 2F are cross-sectional views showing a fabrication process of an array substrate for a transflective LCD device according to the related art.
Figure 2B:
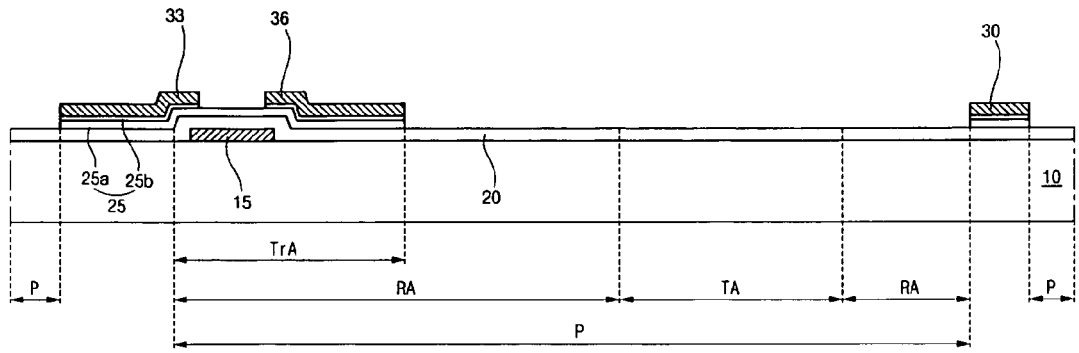
Figure 2C:
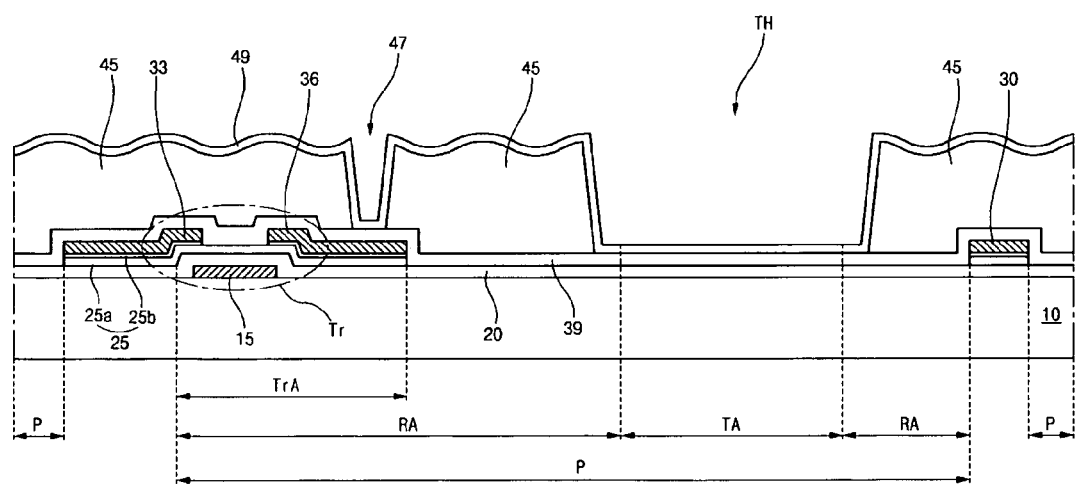
Figure 2D:
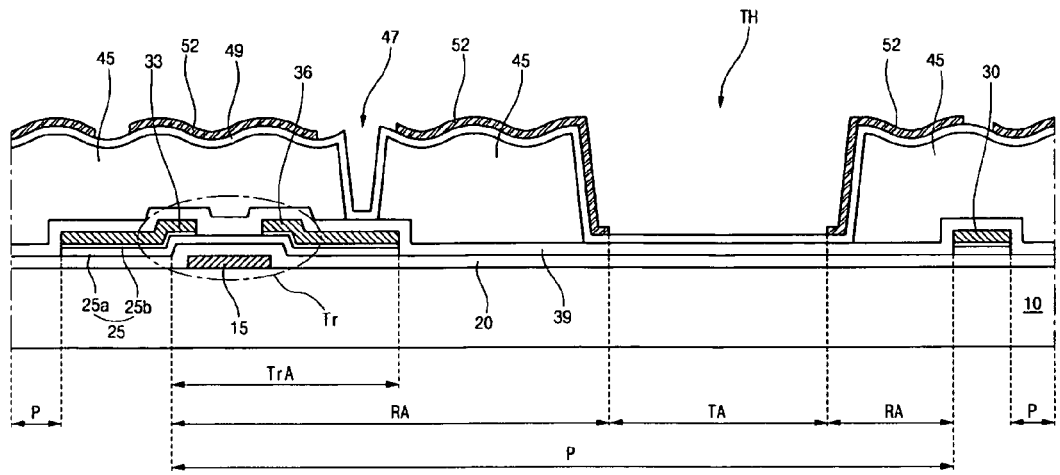
Figure 2E:
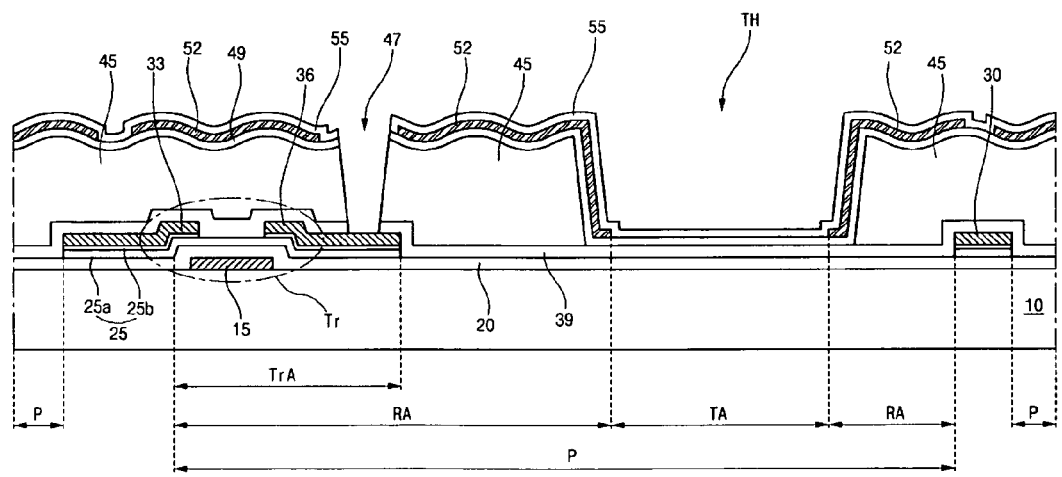
Figure 2F:
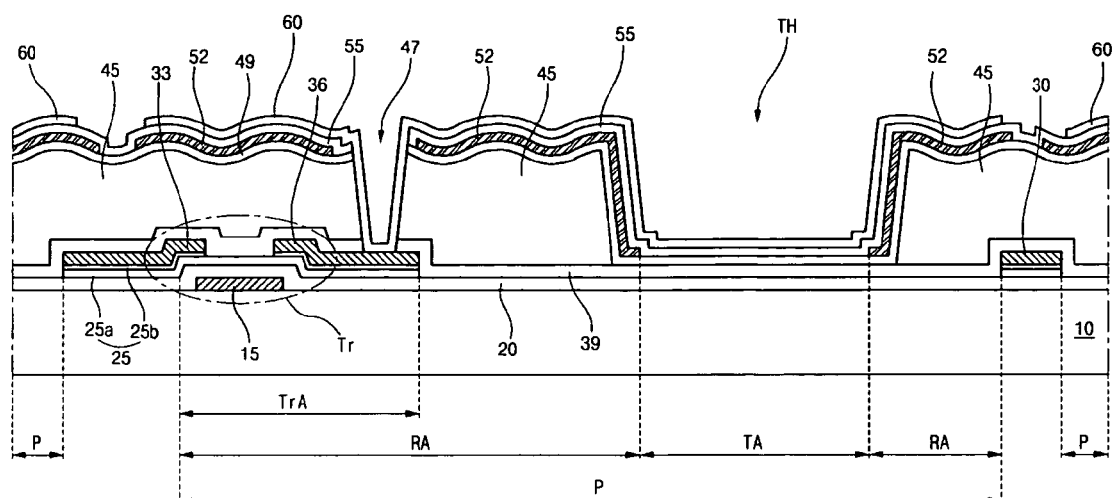
Figure 3:
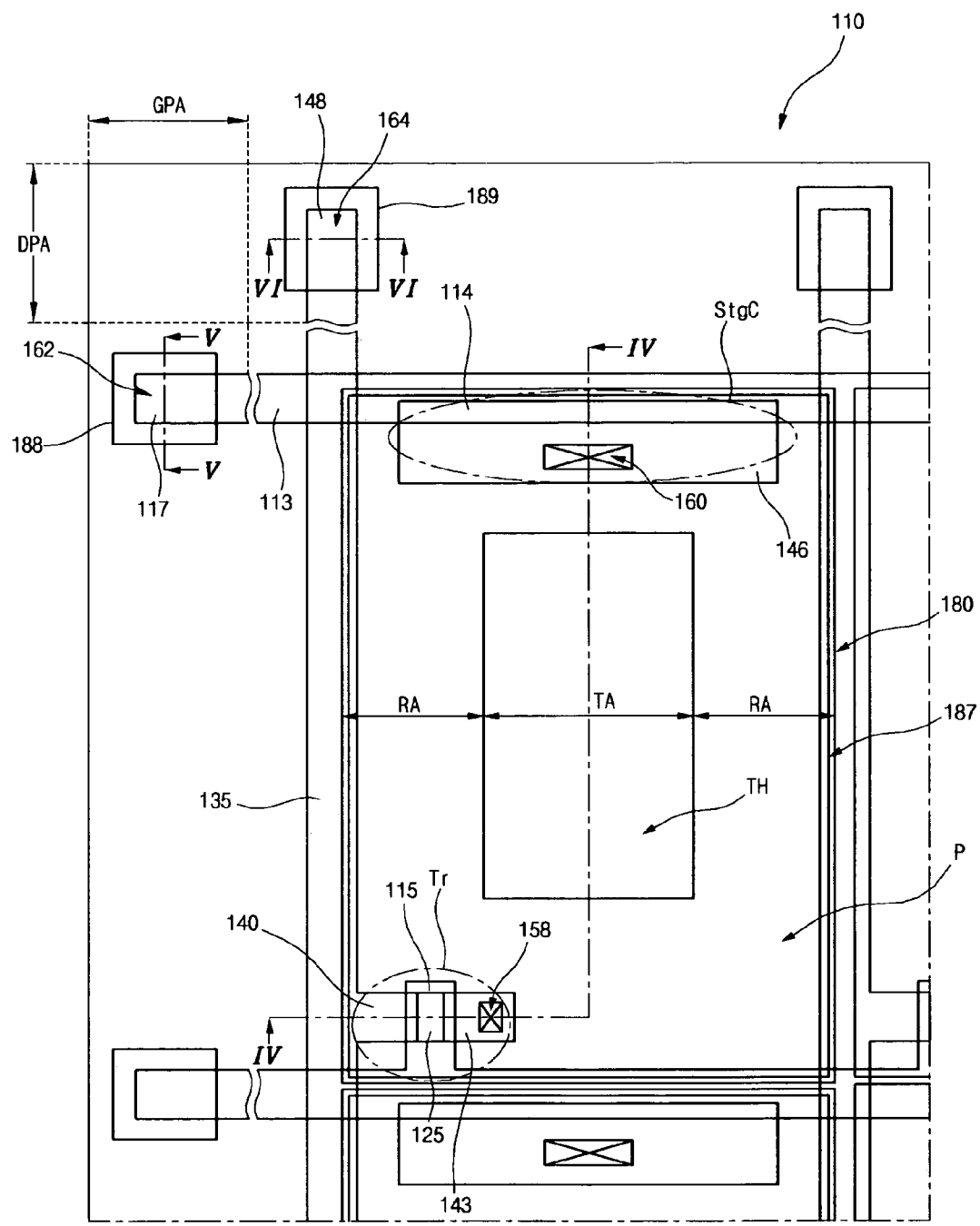
FIG. 3 is a plan view of an array substrate for a transflective LCD device according to an embodiment of the present invention.

FIG. 3 is a plan view of an array substrate for a transflective LCD device according to an embodiment of the present invention. As shown in FIG. 3, a gate line 113 and a data line 135 are formed on a substrate 110. The gate line 113 and the data line 135 cross each other, to thereby define a pixel region "P." A thin film transistor (TFT) "Tr," a switching element, is connected to the gate line 113 and the data line 135. The TFT "Tr" includes a gate electrode 115, a gate insulating layer (not shown), a semiconductor layer 125, a source electrode 140 and a drain electrode 143. The semiconductor layer 125 includes an active layer and an ohmic contact layer. A gate pad 117 is formed at one end of the gate line 113, and a data pad 148 is formed at one end of the data line 135. Although not shown in FIG. 3, an external driving circuit contacts the gate pad 117 and the data pad 148, and supplies a gate signal and a data signal through the gate pad 117 and the data pad 148, respectively.

The pixel region "P" includes a transmissive area "TA" at a central portion thereof and a reflective area "RA" surrounding the transmissive area "TA." A second passivation layer (not shown) of an organic insulating material has a through hole (TH) corresponding to the transmissive area "TA," and a reflective plate 180 is formed to correspond to the reflective area "RA." The second passivation layer has an uneven top surface to prevent a mirror reflection at the reflective plate 180. In addition, a pixel electrode 187 of a transparent conductive material is formed in the transmissive area "TA" and the reflective area "RA." The pixel electrode 187 is connected to the drain electrode 143 of the TFT "Tr" through a drain contact hole 158.

A storage capacitor "StgC" is formed in a boundary of the pixel region "P." The storage capacitor "StgC" includes a first storage electrode 114 that is a portion of the gate line 113, a dielectric layer (not shown) that is a portion of the gate insulating layer on the first storage electrode 114 and a second storage electrode 146 on the dielectric layer over the first storage electrode 114. The second storage electrode 146 is connected to the pixel electrode 187 through a storage contact hole 160.

In this embodiment, the storage capacitor "StgC" has a storage-on-gate structure where the gate line 113 is used as the first storage electrode 114, more particularly, a storage-on-previous gate structure where an nth pixel region uses a $(n-1)^{th}$ gate line as a first storage capacitor. In another embodiment, however, a storage capacitor can have a storage-on-common structure, where a common line parallel to the gate line is used as a first storage electrode, and a metal pattern overlapping the common line and connected to a pixel electrode through a contact hole is used as a second storage electrode.

Figure 4:
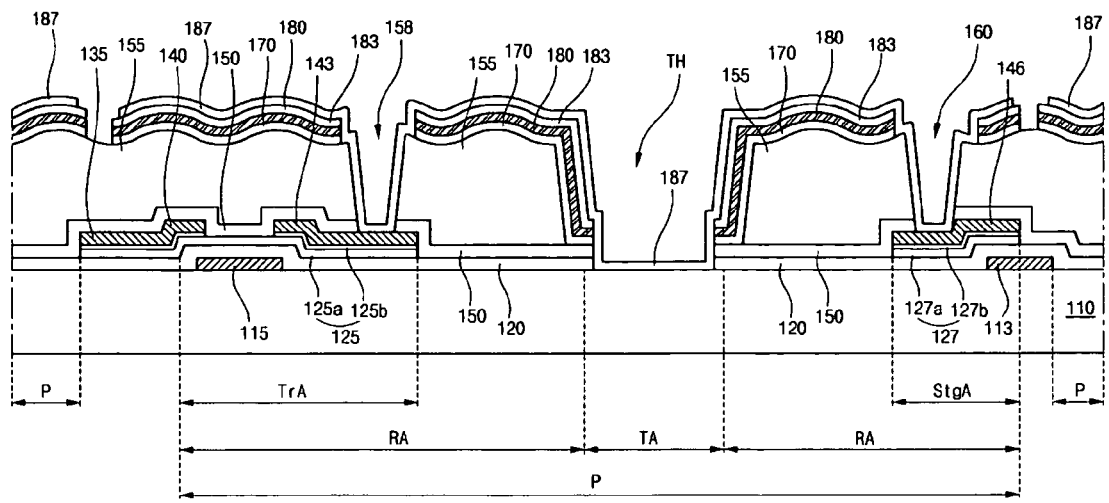
FIG. 4 is a cross-sectional view along line "IV-IV" of FIG. 3.
Figure 5:
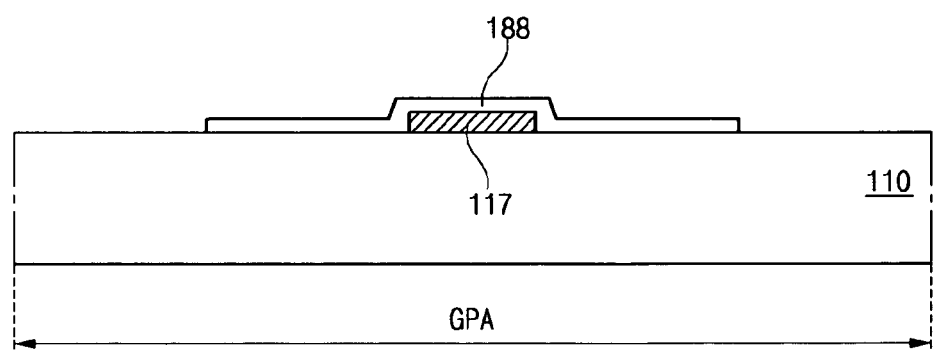
FIG. 5 is a cross-sectional view along line "V-V" of FIG. 3.
Figure 6:
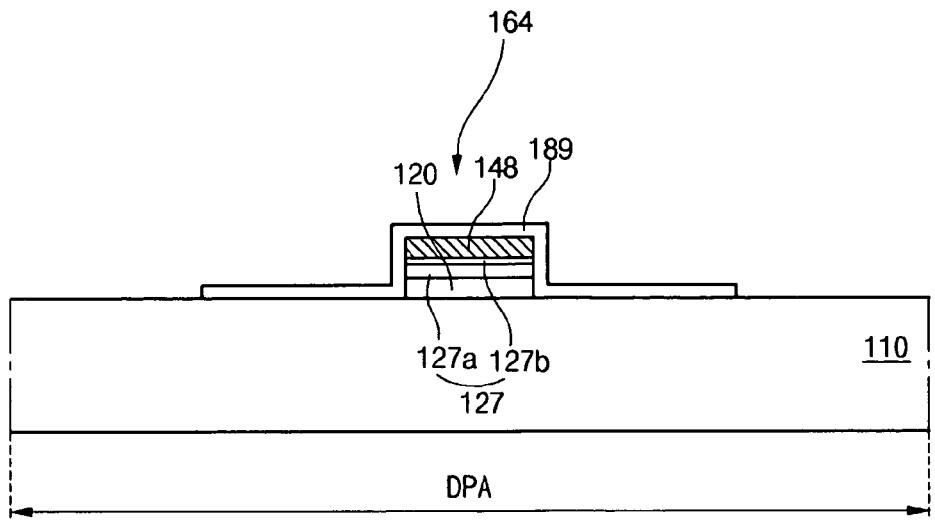
FIG. 6 is a cross-sectional view along line "VI-VI" of FIG. 3.

FIG. 4 is a cross-sectional view along line "IV-IV" of FIG. 3, and FIG. 5 is a cross-sectional view along line "V-V" of FIG. 3. In addition, FIG. 6 is a cross-sectional view along line "VI-VI" of FIG. 3. As shown in FIGS. 4 to 6, a substrate 110 has a pixel region "P" defined by a crossing of a gate line 113 and a data line 135. A gate pad area "GPA" is at one end of the gate line 113 and a data pad area "DPA" is at one end of the data line 135. Further, a gate pad 117 is formed in the gate pad area "GPA" and a data pad 148 is formed in the data pad area "DPA." The pixel region "P" includes a transmissive area "TA" corresponding to a through hole "TH" and a reflective area "RA" corresponding to a reflective plate 180. The reflective area "RA" includes a transistor area "TrA" where a thin film transistor (TFT) "Tr" is formed and a storage capacitor area "StgA" where a storage capacitor "StgC" is formed.

The gate line 113 is formed on the substrate 110 and a gate electrode 115 extending from the gate line 113 is formed in the transistor area "TrA" of the reflective area "RA." A gate insulating layer 120 is formed on the gate electrode 115, and a semiconductor layer 125 is formed on the gate insulating layer 120. The semiconductor layer 125 can include an intrinsic amorphous silicon active layer 125a and an ohmic contact layer 125b having impurity-doped amorphous silicon. The ohmic contact layer 125b is separated into two portions so as to expose the active layer 125a between the two portions. Source and drain electrodes 140 and 143 are formed on the portions of the ohmic contact layer 125b. The gate electrode 115, the semiconductor layer 125, the source electrode 140 and the drain electrode 143 constitute the thin film transistor (TFT) "Tr" as a switching element. The data line 135, which crosses the gate line 113 to define the pixel region "P," is formed on the gate insulating layer 120. The data line 135 is connected to the source electrode 140 of the TFT "Tr."

The gate pad 117 is formed in the gate pad area "GPA" for connection to one end of the gate line 113 and the data pad 148 is formed in the data pad area "DPA" for connection to one end of the data line 135. In the storage area "StgA," a second storage electrode 146 having an island shape is formed on the gate insulating layer 120 over the gate line 113. The second storage electrode 146 can be formed of the same material as the source and drain electrodes 140 and 143.

A first passivation layer 150 of an inorganic insulating material is formed on the TFT "Tr," and a second passivation layer 155 of an organic insulating material is formed on the first passivation layer 150 corresponding to the reflective area "RA." The second passivation layer 155 has an uneven top surface contour that is like the top surface of the reflective plate 180, which is subsequently formed over the second passivation layer 155. A portion of the second passivation layer 155 corresponding to the transmissive area "TA" is removed to form the through hole "TH" exposing the substrate 110. Other portions of the second passivation layer 155 corresponding to the gate pad area "GPA" and the data pad area "DPA" are removed to expose the gate pad 117 and the data pad 148. Further, the second passivation layer 155 has a drain contact hole 158 exposing the drain electrode 143 and a storage contact hole 160 exposing the second storage electrode 146 formed by removing portions of the second passivation layer 155.

A third passivation layer 170 of an inorganic insulating material is formed on the second passivation layer 155 that has the same uneven top surface contour as the second passivation layer 155. A reflective plate 180 corresponding to the reflective area "RA" is formed on the third passivation layer 170 and has the same uneven top surface contour as the third passivation layer 170. A fourth passivation layer 183 of an inorganic insulating material is formed on the reflective plate 180. A metallic material, such as aluminum (Al) or aluminum (Al) alloy, having a high reflectance can be used for the reflective plate 180.

Portions of the third passivation layer 170, the reflective plate 180 and the fourth passivation layer 183 corresponding to the through hole "TH," the drain contact hole 158 and the storage contact hole 160 are removed. In addition, portions of the third passivation layer 170, the reflective plate 180 and the fourth passivation layer 183 corresponding to the gate pad 117 and the data pad 148 are removed to expose the gate pad 117 and the data pad 148. As a result, the through hole "TH" is formed through the fourth passivation layer 183, the reflective plate 180, the third passivation layer 170, the second passivation layer 155, the first passivation layer 150 and the gate insulating layer 120 in the transmissive area "TA" to expose the substrate 110. The drain contact hole 158 is formed through the fourth passivation layer 183, the reflective plate 180, the third passivation layer 170, the second passivation layer 155 and the first passivation layer 150 in the transistor area "TrA" to expose the drain electrode 143, and the storage contact hole 160 is formed through the fourth passivation layer 183, the reflective plate 180, the third passivation layer 170, the second passivation layer 155 and the first passivation layer 150 in the storage area "StgA" to expose the second storage electrode 146. In the gate pad area "GPA" and the data pad area "DPA," since the fourth passivation layer 183, the reflective plate 180, the third passivation layer 170, the second passivation layer 155, the first passivation layer 150 and the gate insulating layer 120 are removed, the gate pad 117, the data pad 148 and the substrate 110 are exposed.

A pixel electrode 187 of a transparent conductive material is formed on the fourth passivation layer 183. The pixel electrode 187 is connected to the drain electrode 143 through the drain contact hole 158 and connected to the second storage electrode 146 through the storage contact hole 160. Since the pixel electrode 187 is formed in the whole pixel region "P," the pixel electrode 187 contacts the fourth passivation layer 183 in the reflective area "RA" and the substrate 110 in the transmissive area "TA." Since a side surface of the reflective plate 180 is exposed on a sidewall of the through hole "TH," the pixel electrode 187 covering the sidewall of the through hole "TH" can contact the sidewall of the reflective plate 180 and the reflective plate 180 can function as an electrode driving a liquid crystal layer. In another embodiment where the reflective plate 180 is over-etched not to be exposed, however, the pixel electrode 187 can not contact the reflective plate 180 and the reflective plate 180 can function as a reflector only.

In the gate pad area "GPA" and the data pad area "DPA," a gate pad terminal 188 and a data pad terminal 189 cover and are formed on the gate pad 117 and the data pad 148, respectively. The gate pad terminal 188 and the data pad terminal 189 are formed of the same layer and the same material as the pixel electrode 187.

FIGS. 7A to 7H, 8A to 8H, and 9A to 9H are cross-sectional views showing a fabricating process of an array substrate for a transflective LCD device according to an embodiment of the present invention. FIGS. 7A to 7H are cross-sectional views along line "IV-IV" of FIG. 3. In addition, FIGS. 8A to 8H are cross-sectional views along line "V-V" of FIG. 3, and FIGS. 9A to 9H are cross-sectional views along line "VI-VI" of FIG. 3.

Figure 7A:
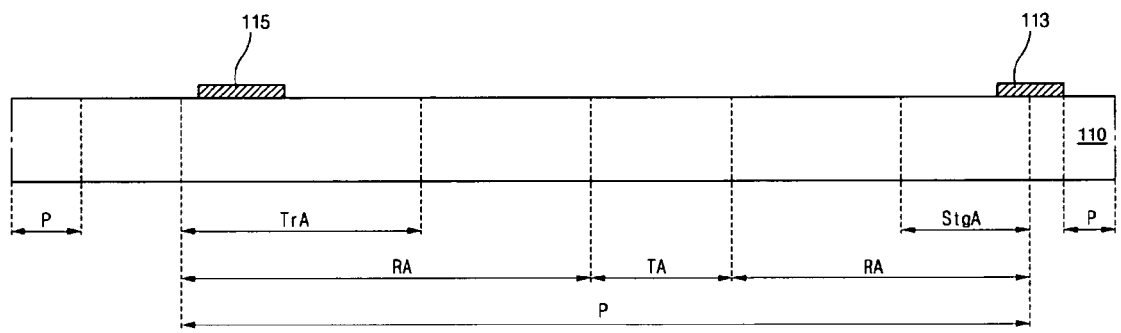
FIGS. 7A to 7H are cross-sectional views, which are along line "IV-IV" of FIG. 3, showing a fabricating process of an array substrate for a transflective LCD device according to an embodiment of the present invention.
Figure 8A:
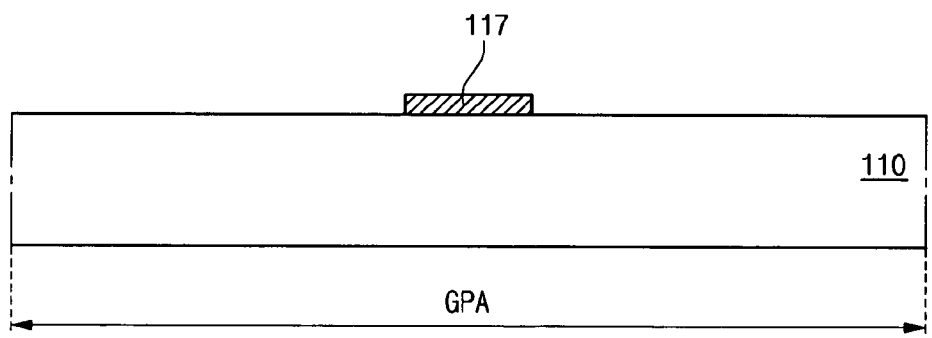
FIGS. 8A to 8H are cross-sectional views, which are along line "V-V" of FIG. 3, showing a fabricating process of an array substrate for a transflective LCD device according to an embodiment of the present invention.
Figure 9A:
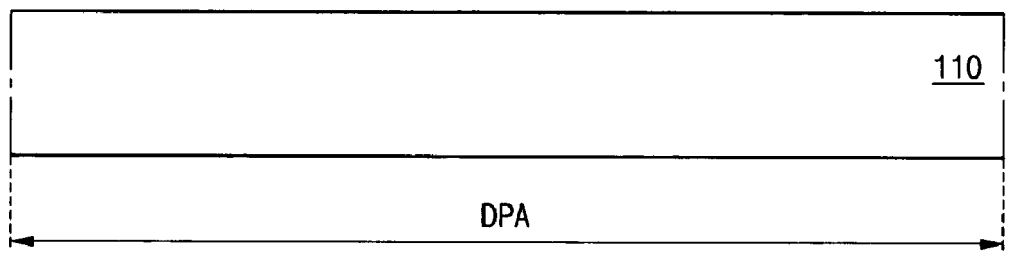
FIGS. 9A to 9H are cross-sectional views, which are along line "VI-VI" of FIG. 3, showing a fabricating process of an array substrate for a transflective LCD device according to an embodiment of the present invention.

In FIGS. 7A, 8A and 9A, after a first metal layer (not shown) is formed on a substrate 110, the first metal layer is patterned through a first mask process to form a gate line 113, a gate electrode 115 extending from the gate line 113 in a transistor area "TrA" of a pixel region "P" and a gate pad 117 at one end of the gate line 113. In the first mask process, a first photoresist (PR) layer (not shown) can be formed on the first metal layer and exposed through a first mask (not shown) having a transmissive region and a blocking region. The exposed first PR layer is developed to form a first PR pattern, and the first metal layer is etched using the first PR pattern as an etch mask to form the gate line 113, the gate electrode 115 and the gate pad 117.

Figure 7B:
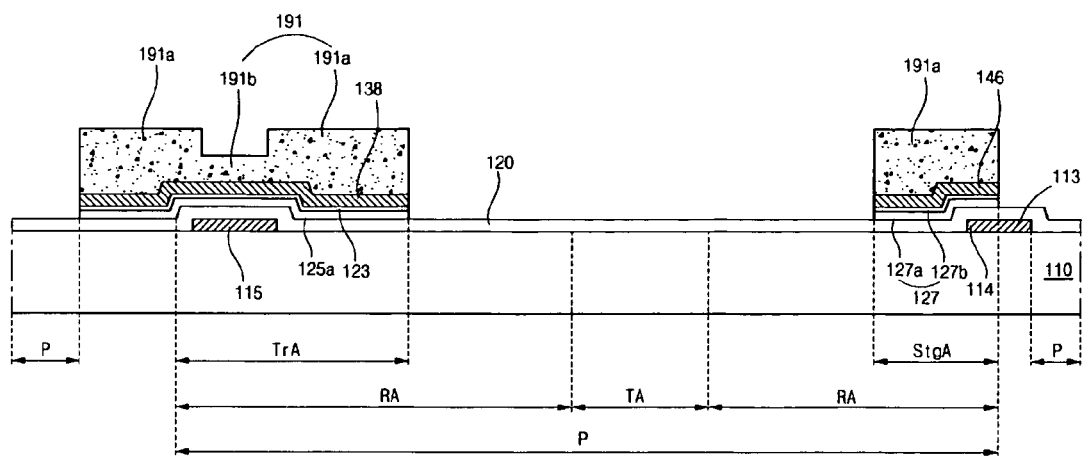
Figure 8B:
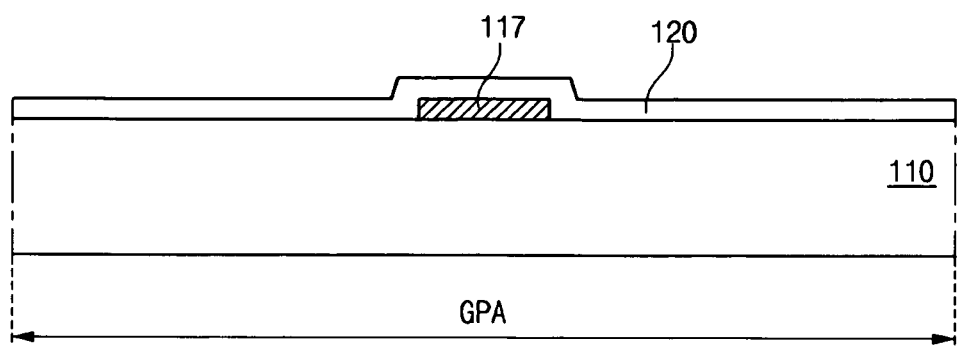
Figure 9B:
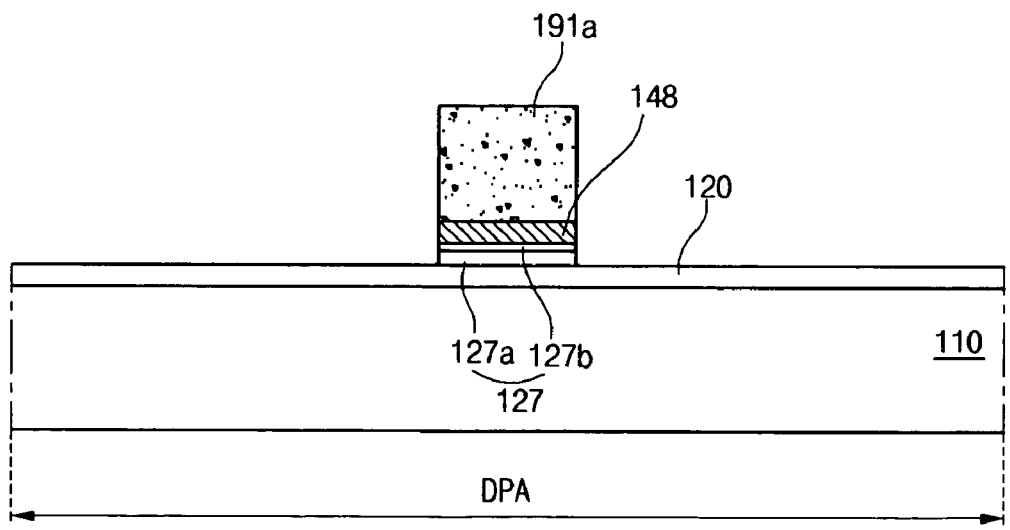

In FIGS. 7B, 8B and 9B, a gate insulating layer 120 is formed on the gate line 113, the gate electrode 115 and the gate pad 117 by depositing an inorganic insulating material, such as silicon oxide ($SiO_2$) and silicon nitride ($SiN_x$). An intrinsic amorphous silicon layer (not shown), a doped amorphous silicon layer (not shown) and a second metal layer are sequentially formed on the gate insulating layer 120. Through a second mask process, the second metal layer is patterned to form a source electrode 140, a drain electrode 143, a data line 135 and a data pad 148, and the doped amorphous silicon layer and the intrinsic amorphous silicon layer are patterned to form a semiconductor layer 125 including an active layer 125a and an ohmic contact layer 125b. In the second mask process, a second PR layer (not shown) can be formed on the second metal layer, and can be exposed through a second mask (not shown) having a transmissive region, a blocking region and a half-transmissive region such that a transmittance of the half-transmissive region is greater than a transmittance of the blocking region and smaller than a transmittance of the transmissive region. Since the half-transmissive region of the second mask can be obtained from a slit pattern or a half-tone pattern, an exposure step using the second mask is referred to as a diffraction exposure or a half-tone exposure. The exposed second PR layer is developed to form a second PR pattern 191 corresponding to the transistor area "TrA," the storage area "StgA" and the data pad area "DPA."

The second PR pattern 191 includes a first portion 191a having a first thickness and a second portion 191b having a second thickness smaller than the first thickness. The first portion 191a of the second PR pattern 191 corresponds to a portion where the second metal layer, the doped amorphous silicon layer and the intrinsic amorphous silicon layer remain in a subsequent process, and the second portion 191b of the second PR layer 191 corresponds to another portion where the second metal layer and the doped amorphous silicon layer are removed and the intrinsic amorphous silicon layer remains in a subsequent process. In the transistor area "TrA," for example, the first portion 191a of the second PR layer 191 corresponds to a portion for source and drain electrodes and the second portion 191b of the second PR layer corresponds to another portion for a channel region. Accordingly, the first portion 191a of the second PR layer 191 corresponds to a data line, a source electrode, a drain electrode, a second storage electrode and a data pad of a subsequent process, while the second portion 191b of the second PR layer 191 corresponds to the channel region between the source and drain electrodes.

The second metal layer, the doped amorphous silicon layer and the intrinsic amorphous silicon layer are etched using the second PR pattern 191 having the first and second portions 191a and 191b as an etch mask to form a source-drain pattern 138, a doped amorphous silicon pattern 123 under the source-drain pattern 138 and an active layer 125a under the doped amorphous silicon pattern 123 in the transistor area "TrA." At the same time, a data line 135 crossing the gate line 113, a data pad 148 at one end of the data line 135 and a second storage electrode 146 overlapping the gate line 113 are formed by etching the second metal layer, the doped amorphous silicon layer and the intrinsic amorphous silicon layer. A portion of the gate line 113 overlapping the second storage electrode 146 in the storage area "StgA" functions as a first storage electrode 114. Here, a storage doped amorphous silicon pattern 127a and a storage intrinsic amorphous silicon pattern 127b having the same shape as the second storage electrode 146 are formed under the second storage electrode 146. Similarly, a data doped amorphous silicon pattern and a data intrinsic amorphous silicon pattern having the same shape as the data line 135 are formed under the data line 135.

Figure 7C:
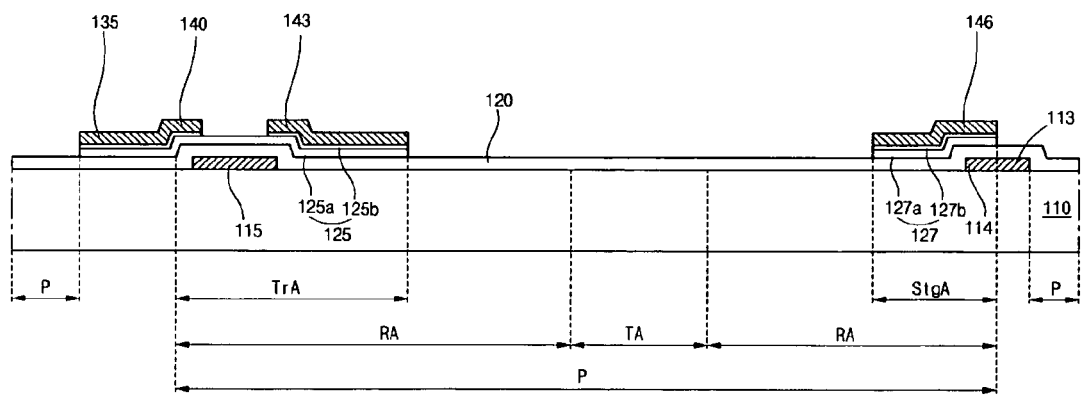
Figure 8C:
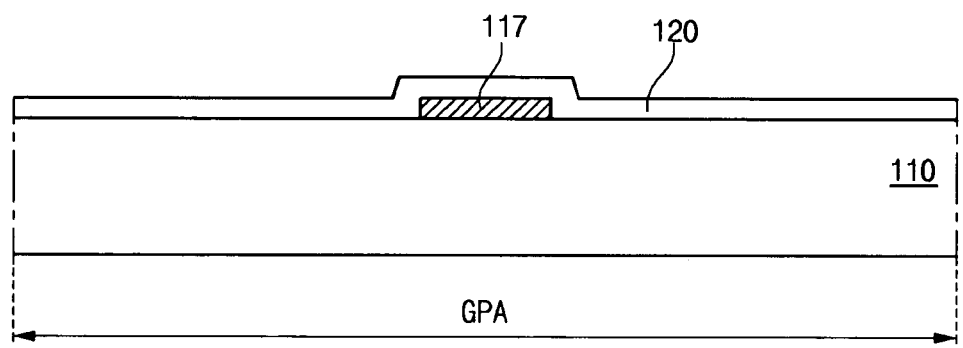
Figure 9C:
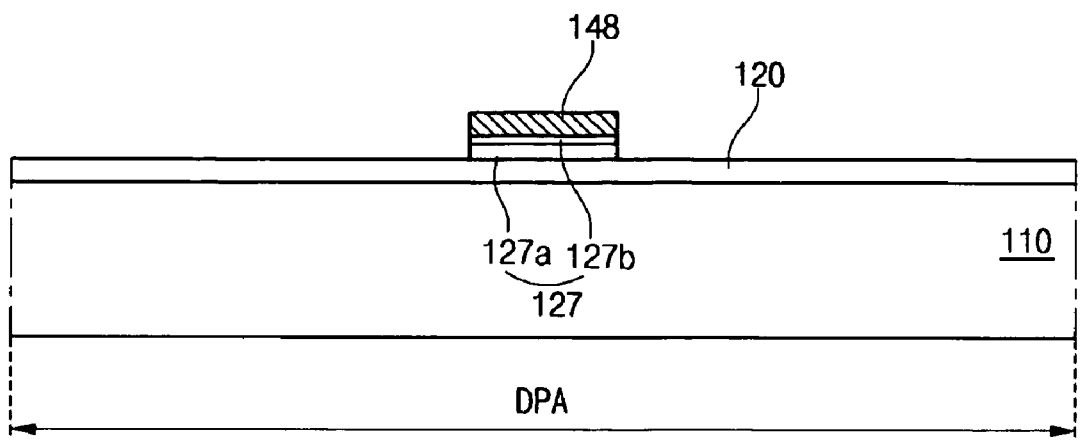

In FIGS. 7C, 8C and 9C, the second portion 191b (of FIG. 7B) of the second PR pattern 191 are removed by an ashing step to expose a portion of the source-drain pattern 138 (of FIG. 7B). Since the first portion 191a (of FIGS. 7B and 9B) of the second PR pattern 191 has the first thickness greater than the second thickness, the first portion 191a of the second PR pattern 191 remains even after the second portion 191b of the second PR pattern 191 is removed. The remaining first portion (not shown) of the second PR pattern 191 can have a thickness corresponding to a difference between the first and second thicknesses.

The portion of the source-drain pattern 138 (of FIG. 7B) exposed through the remaining first portion 191a of the second PR pattern 191 and the doped amorphous silicon pattern 123 (of FIG. 7B) under the exposed portion of the source-drain electrode 138 are etched using the remaining first portion 191a of the second PR pattern 191 as an etch mask to form a source electrode 140, a drain electrode 143 and an ohmic contact layer 125b under the source and drain electrodes 140 and 143. The source and drain electrodes 140 and 143 face and are spaced apart from each other in the transistor area "TrA," and the ohmic contact layer 125b has the same shape as the source and drain electrodes 140 and 143. After the source electrode 140, the drain electrode 143 and the ohmic contact layer 125b are formed, the remaining first portion of the second PR pattern 191 is removed by a stripping step.

Figure 7D:
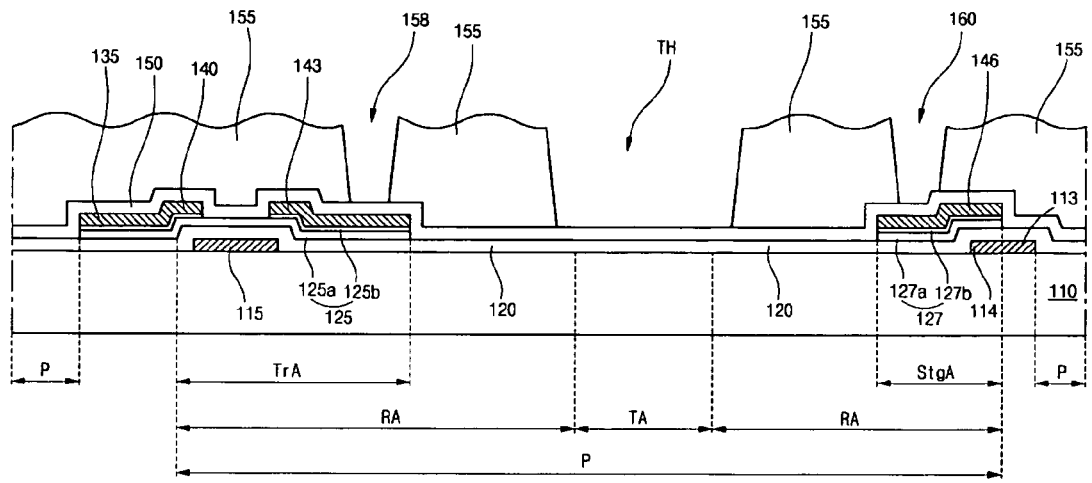
Figure 8D:
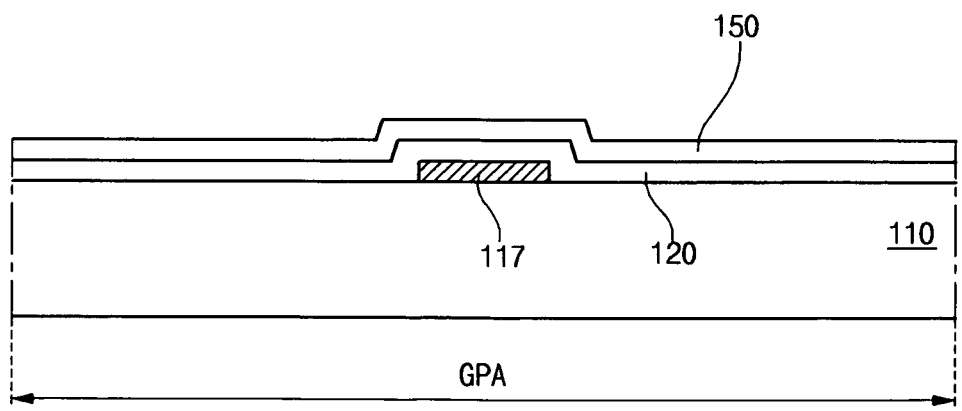
Figure 9D:
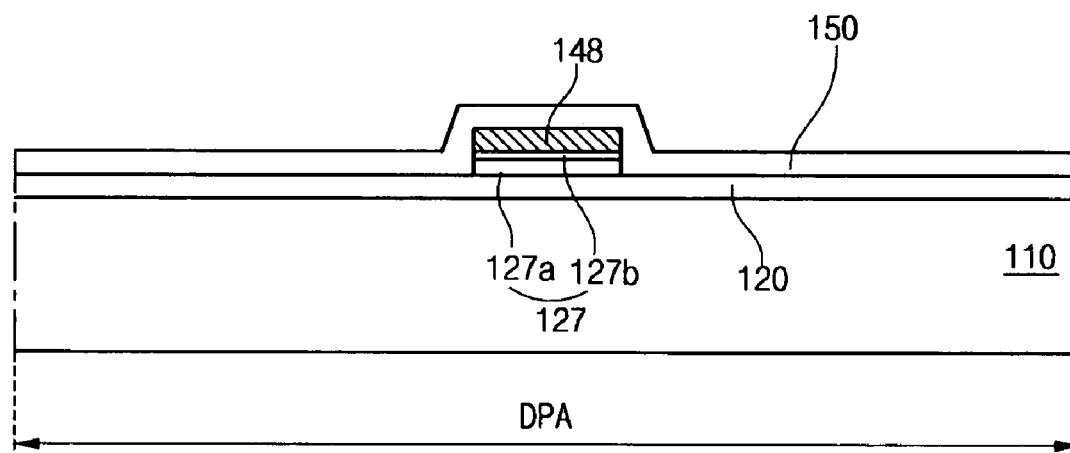

In FIGS. 7D, 8D and 9D, a first passivation layer 150 of an inorganic insulating material, such as silicon oxide ($SiO_2$) or silicon nitride ($SiN_x$), is formed on the data line 135, the source electrode 140, the drain electrode 143 and the second storage electrode 146. When the active layer 125a contacts a second passivation layer 155 of an organic material in a subsequent process, the active layer 125a may be degraded by contamination that causes deterioration of the TFT "Tr." To prevent such contamination, the first passivation layer 150 prevents contact between the active layer 125a and the second passivation layer 155. In an alternative embodiment, the first passivation layer 150 can be omitted when possible degradation of the active layer 125a is negligible.

The second passivation layer 155 is formed on the first passivation layer 150 through a third mask process. A photosensitive organic insulating material layer is formed on the first passivation layer 150, and is exposed through a third mask (not shown) having transmissive regions, blocking regions and half-transmissive regions. A transmittance of the half-transmissive region is greater than a transmittance of the blocking region and smaller than a transmittance of the transmissive region. For example, when the organic insulating material layer has a positive type photosensitivity, the third mask can be aligned such that transmissive regions correspond to the transmissive area "TA," the gate pad area "GPA," the data pad area "DPA," the drain contact hole 158 and the storage contact hole 160, and alternating blocking and the half-transmissive regions correspond to the reflective area "RA." In the alternative, when the organic insulating material layer has a negative type photosensitivity, the third mask can be aligned such that blocking regions correspond to the transmissive area "TA," the gate pad area "GPA," the data pad area "DPA," the drain contact hole 158 and the storage contact hole 160, and alternating transmissive regions and half-transmissive regions correspond to the reflective area "RA."

The organic insulating material layer is exposed through the third mask and the exposed organic insulating material layer is developed to form the through hole "TH" exposing the first passivation layer 150 in the transmissive area "TA," the drain contact hole 158 exposing the first passivation layer 150 on the drain electrode 143, and the storage contact hole 160 exposing the first passivation layer 150 on the second storage electrode 146. The second passivation layer 155 is reconfigured to have an uneven top surface due to the half-transmissive regions of the third mask. The round shape of the uneven top surface of the second passivation layer 155 can be obtained through an additional heat treatment step.

Figure 7E:
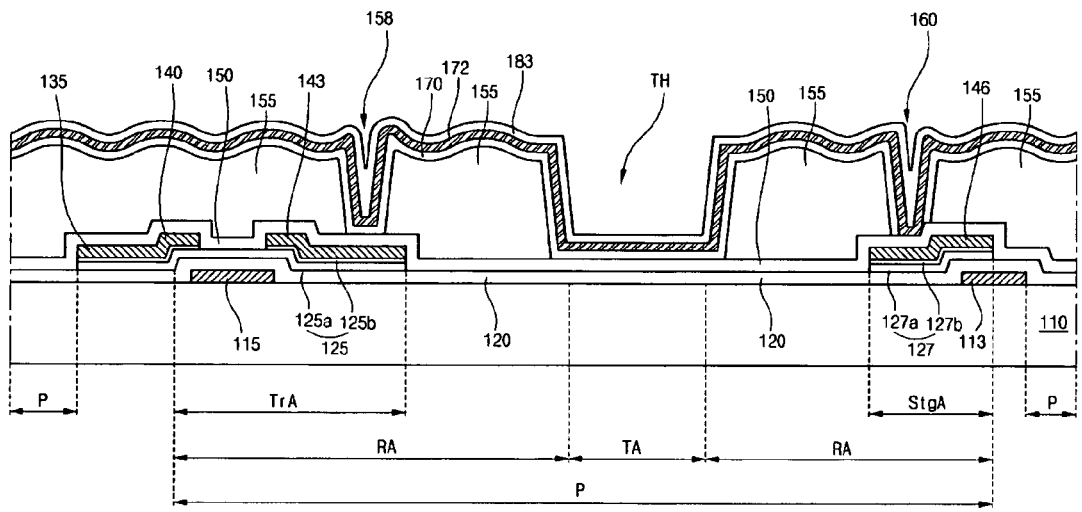
Figure 8E:
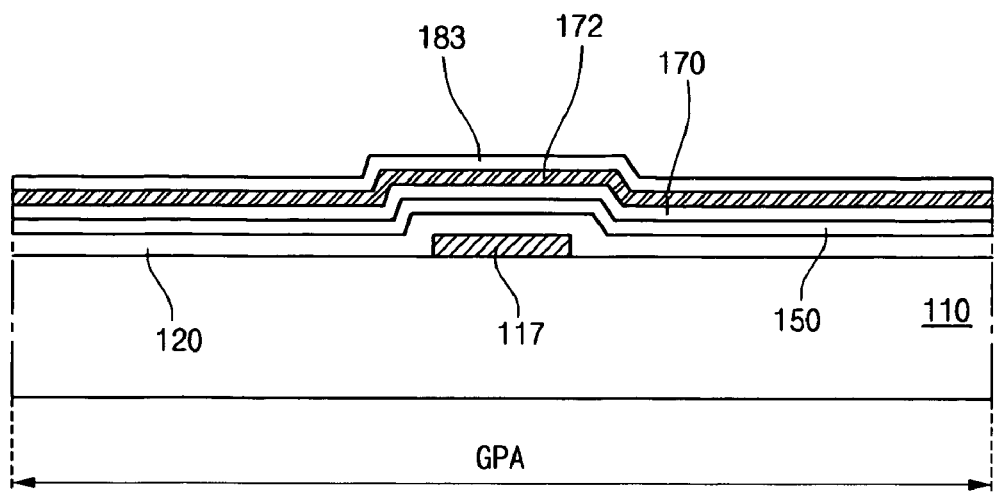
Figure 9E:
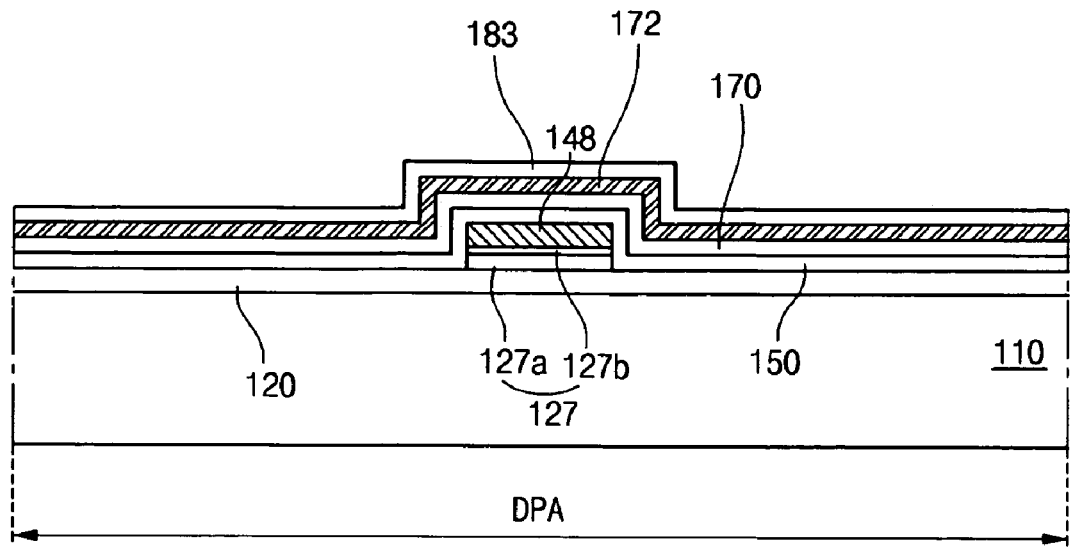

As shown in FIGS. 7E, 8E and 9E, a third passivation layer 170, a third metal layer 172 and a fourth passivation layer 183 are sequentially formed on the second passivation layer 155. The third and fourth passivation layers 170 and 183 include an inorganic insulating material, such as silicon oxide ($SiO_2$) and silicon nitride ($SiN_x$), and the third metal layer 172 is formed of a metallic material, such as aluminum (Al) or aluminum (Al) alloy having a high reflectance. The third passivation layer 170 of an inorganic insulating material is formed to improve contact property between the second passivation layer 155 of an organic insulating material and the third metal layer 172 of a metallic material. Alternatively, the third passivation layer 170 can be omitted.

Figure 7F:
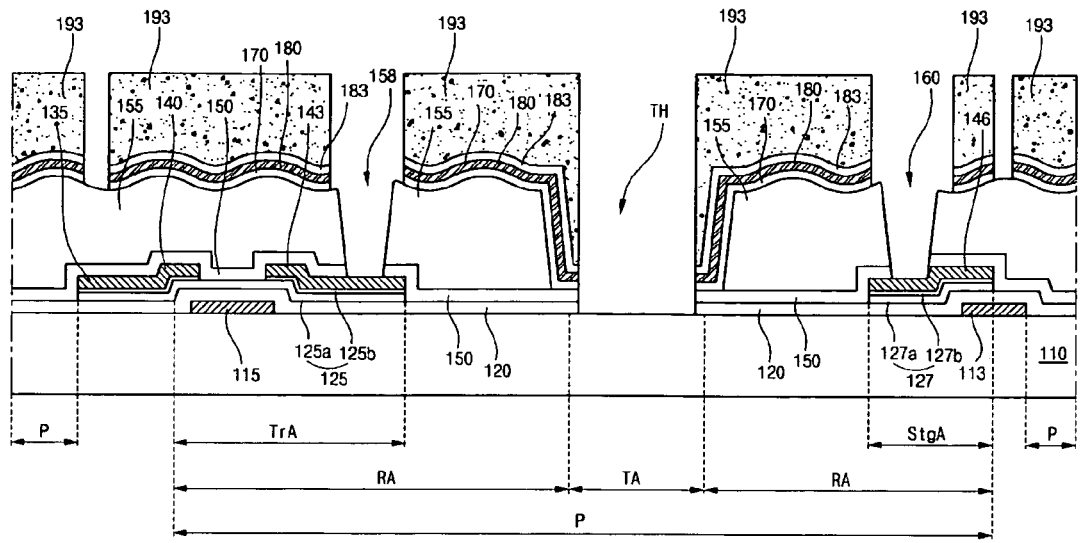
Figure 8F:
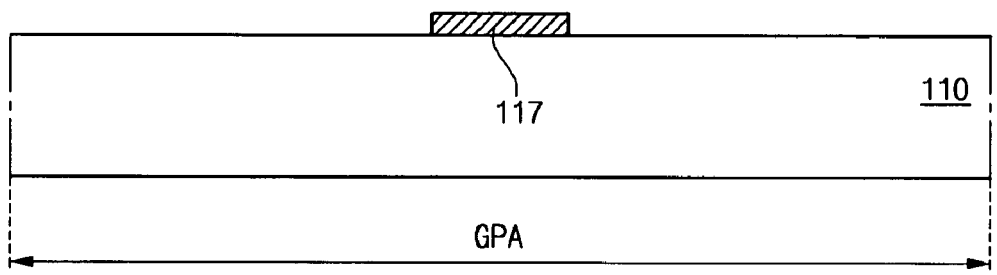
Figure 9F:
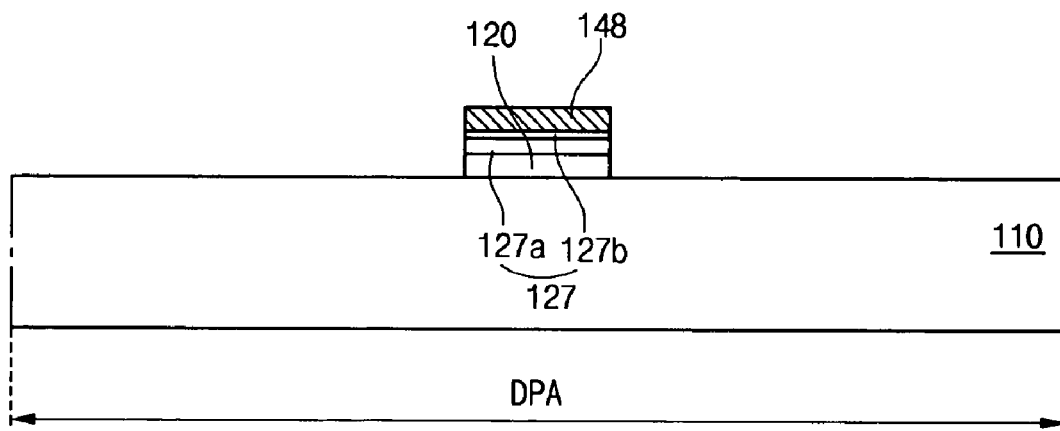

As shown in FIGS. 7F, 8F and 9F, a reflective plate 180 is formed through a fourth mask process. A third PR layer (not shown) is formed on the fourth passivation layer 183 and is exposed through a fourth mask (not shown) having a transmissive region and a blocking region. The exposed third PR layer is developed to form a third PR pattern 193 exposing portions corresponding to the drain contact hole 158, the storage contact hole 160, the through hole "TH," the gate pad area "GPA" and the data pad area "DPA."

The fourth passivation layer 183, the third metal layer 172 (of FIGS. 7E, 8E and 9E), the third passivation layer 170, the first passivation layer 150 and the gate insulating layer 120 are sequentially etched using the third PR pattern 193 as an etch mask to form the reflective plate 180 and to complete the drain contact hole 158 exposing the drain electrode 143, the storage contact hole 160 exposing the second storage electrode 146, the through hole "TH" exposing the substrate 110. In the gate pad area "GPA" and the data pad area "DPA," the gate pad 117, the data pad 148 and the substrate 110 are exposed. As a result, the through hole "TH" is formed through the gate insulating layer 120, the first passivation layer 150, the second passivation layer 155, the third passivation layer 170, the reflective plate 180 and the fourth passivation layer 183. In addition, the drain contact hole 158 and the storage contact hole 160 are formed through the first passivation layer 150, the second passivation layer 155, the third passivation layer 170, the reflective plate 180 and the fourth passivation layer 183.

Since the fourth passivation layer 183, the reflective plate 180 and the third passivation layer 170 are formed through a single mask process, (i.e., a fourth mask process), the fourth passivation layer 183, the reflective plate 180 and the third passivation layer 170 have the same shape as one another. The first and third passivation layers 150 and 170 for improving a contact property of the second passivation layer 155 of an organic insulating material can be omitted in another embodiment. When the first and third passivation layers 150 and 170 are omitted, the fourth passivation layer 183, the third metal layer 172 (of FIGS. 7E, 8E and 9E) and the gate insulating layer 120 are sequentially etched to complete the through hole "TH" and the fourth passivation layer 183 and the third metal layer 172 (of FIGS. 7E, 8E and 9E) are sequentially etched to complete the drain contact hole 158 and the storage contact hole 160 in the fourth mask process.

Figure 7G:
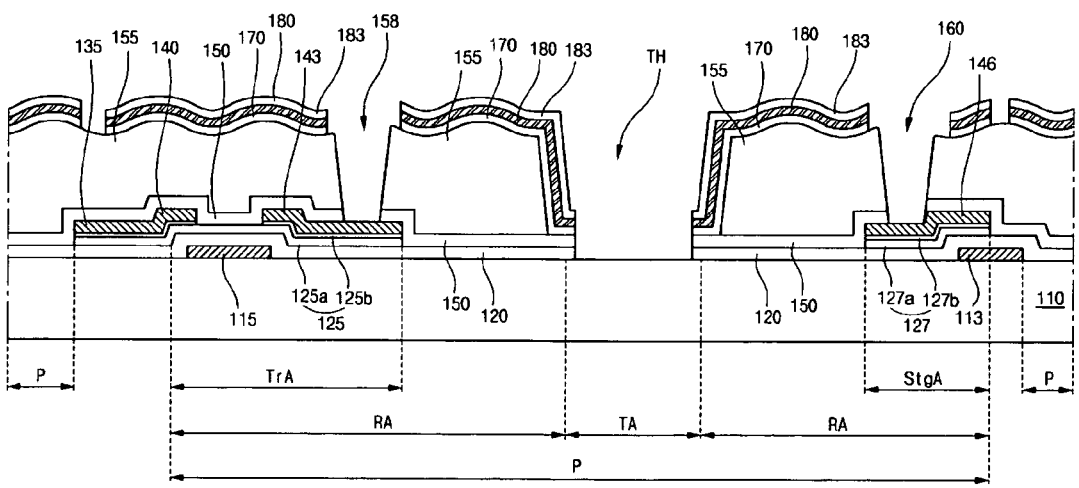
Figure 8G:
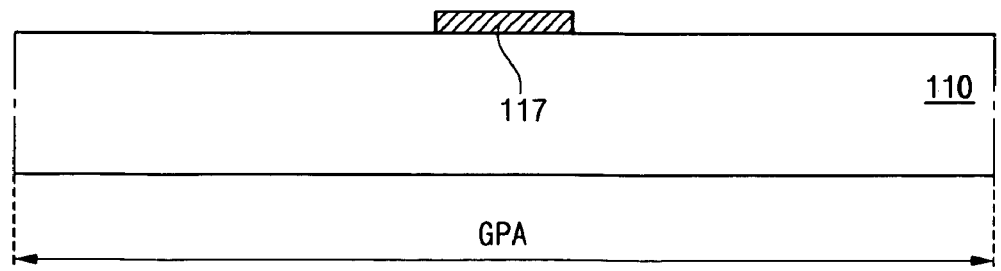
Figure 9G:
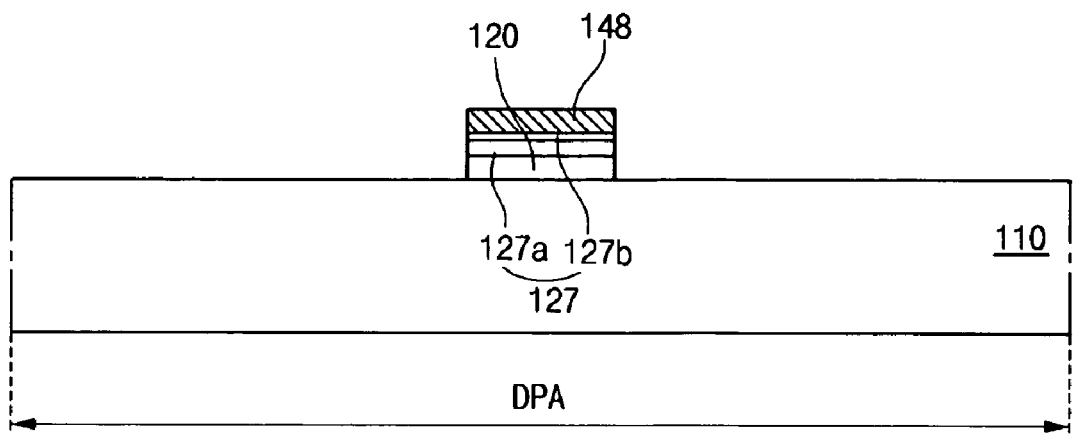

As shown in FIGS. 7G, 8G and 9G, the third PR pattern 193 (of FIGS. 7F, 8F and 9F) is removed by a stripping method.

Figure 7H:
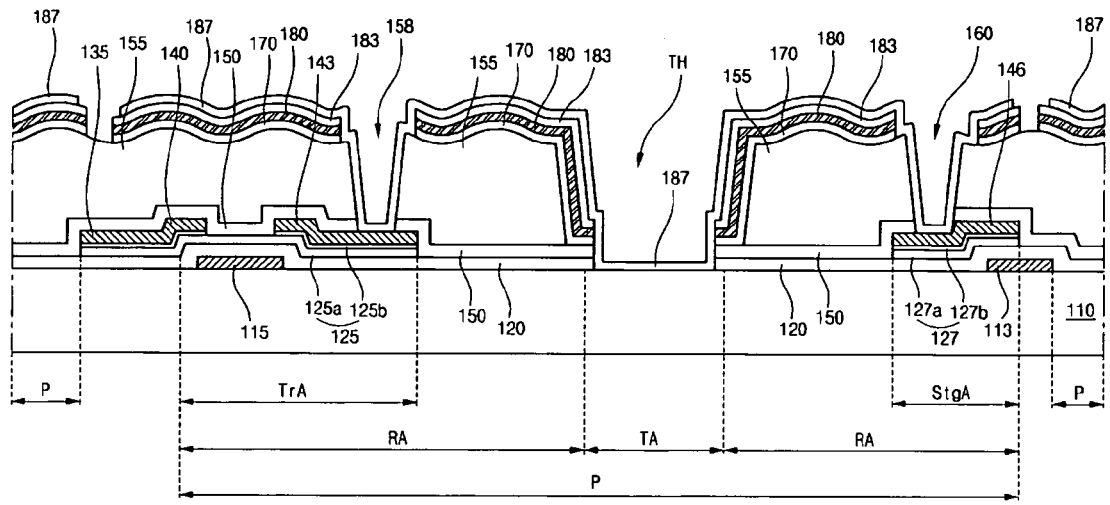
Figure 8H:
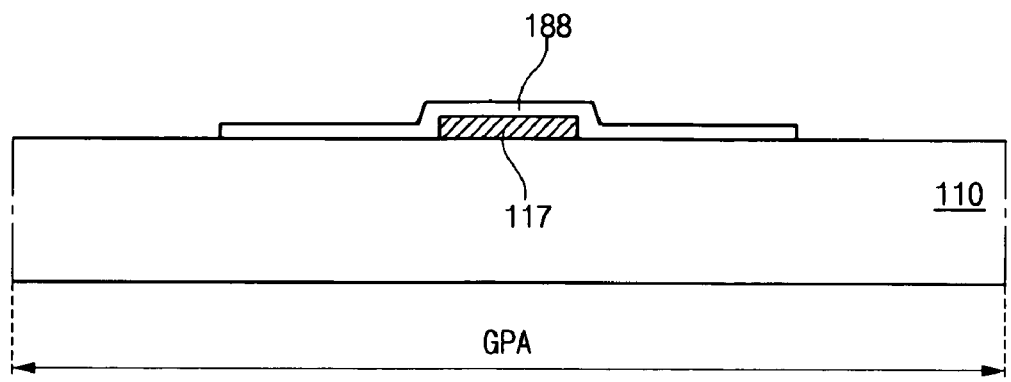
Figure 9H:
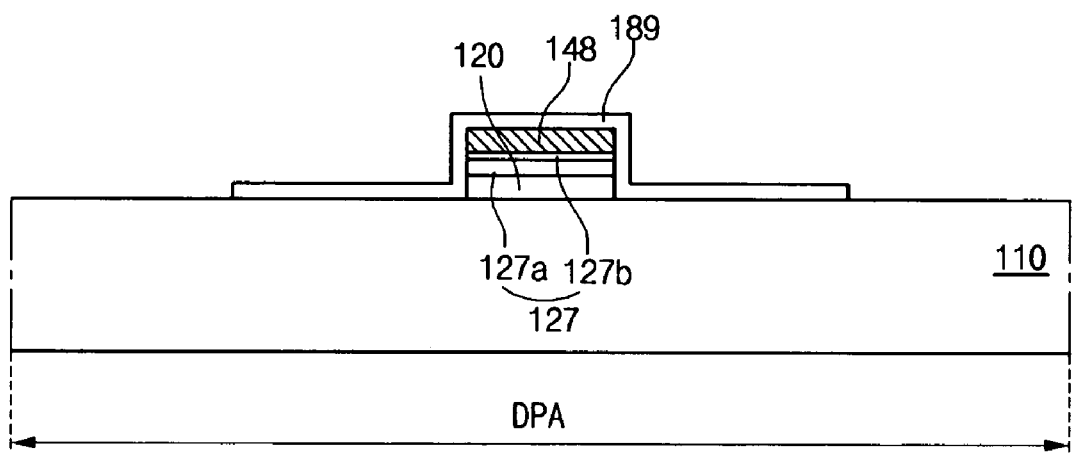

As shown in FIGS. 7H, 8H and 9H, a pixel electrode 187, a gate pad terminal 188 and a data pad terminal 189 of a transparent conductive material are formed through a fifth mask process. In the fifth mask process, after a transparent conductive material layer (not shown) including a transparent conductive material, such as indium-tin oxide (ITO) or indium-zinc-oxide (IZO) is formed on the fourth passivation layer 183, a fourth PR layer (not shown) is formed on the transparent conductive material layer. The fourth PR layer is exposed through a fifth mask (not shown) having a transmissive region and a blocking region to form a fifth PR pattern (not shown). The transparent conductive material layer is etched using the fifth PR pattern as an etch mask to form the pixel electrode 187, the gate pad terminal 188 and the data pad terminal 189. The pixel electrode 187 is disposed within the whole pixel region "P." In addition, the pixel electrode 187 is connected to the drain electrode 143 through the drain contact hole 158 and connected to the second storage electrode 146 through the storage contact hole 160. The gate pad terminal 187 is formed on and completely covers the gate pad 117 in the gate pad area "GPA," and the data pad terminal 188 is formed on and completely covers the data pad 148.

Since the pixel electrode 187 contacts the reflective plate 180 on a sidewall of the through hole "TH," the drain contact hole 158 and the storage contact hole 160, the reflective plate 180 is electrically connected to the drain electrode 143, the second storage electrode 146 and the pixel electrode 187. Accordingly, the reflective plate 180 can function as an electrode driving a liquid crystal layer of a transflective LCD device. Alternatively, the pixel electrode 187 can be formed to be electrically separated from the reflective plate 180 such that the reflective plate 180 functions as a reflector that is electrically floating.

Since an array substrate for a transflective LCD device is fabricated through a five-mask process in embodiments of the present invention, production yield is improved and fabrication costs are reduced. In addition, since a reflective plate having an uneven top surface is formed at a top of the array substrate, mirror reflection is prevented and reflection efficiency is maximized.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An array substrate for a transflective liquid crystal display device, comprising:
a substrate;
a gate line and a data line on the substrate, the gate line and the data line crossing each other to define a pixel region including a transmissive area and a reflective area surrounding the transmissive area;
a thin film transistor having a gate insulating layer, the thin film transistor connected to the gate line and the data line;
a first passivation layer on the thin film transistor, the first passivation layer having a drain contact hole exposing a drain electrode of the thin film transistor and a through hole exposing the substrate in the transmissive area;
a reflective plate on the first passivation layer;
a second passivation layer on the reflective plate; and
a pixel electrode on the second passivation layer, the pixel electrode contacting the substrate in the transmissive area through the through hole and contacting the drain electrode through the drain contact hole,
wherein the first passivation layer is formed of an organic insulating material and has an uneven top surface.

2. The array substrate according to claim 1, further comprising a third passivation layer of an inorganic insulating material between the thin film transistor and the first passivation layer, the third passivation layer having the drain contact hole exposing the drain electrode.

3. The array substrate according to claim 2, further comprising a fourth passivation layer of an inorganic insulating material between the first passivation layer and the reflective plate, the fourth passivation layer having the same shape as the reflective plate.

4. The array substrate according to claim 1, further comprising a gate pad at one end of the gate line and a data pad at one end of the data line.

5. The array substrate according to claim 4, further comprising a gate pad terminal on the gate pad and a data pad terminal on the data pad, wherein the gate pad terminal and the data pad terminal are formed of a transparent conductive material.

6. The array substrate according to claim 5, wherein gate pad terminal and the data pad terminal are formed of the same layer as the pixel electrode.

7. The array substrate according to claim 1, wherein The reflective plate has a top surface with the same shape as the uneven top surface of the first passivation layer.

8. The array substrate according to claim 7, wherein the second Passivation layer has the same shape as reflective plate.

9. The array substrate according to claim 1, wherein the thin film transistor includes a gate electrode, the gate insulating layer on the gate electrode, an active layer on the gate insulating layer over the gate electrode, an ohmic contact layer on the active layer, a source electrode on the ohmic contact layer, the drain electrode spaced apart from the source electrode.

10. An array substrate for a transflective liquid crystal display device, comprising:
a substrate;
a gate line and a data line on the substrate, the gate line and the data line crossing each other to define a pixel region including a transinissive area and a reflective area surrounding the transinissive area;
a thin film transistor having a gate insulating layer, the thin film transistor connected to the gate line and the data line;
a first passivation layer on the thin film transistor, the first passivation layer having a drain contact hole exposing a drain electrode of the thin film transistor and a through hole exposing the substrate in the transmissive area;

a reflective plate on the first passivation layer:

a second passivation layer on the reflective plate:

a pixel electrode on the second passivation layer, the pixel electrode contacting the substrate in the transmissive area through the through hole and contacting the drain electrode through the drain contact hole; and a storage capacitor connected to the pixel electrode, wherein the storage capacitor includes a first storage electrode that is a portion of the gate line, a portion of the gate insulating layer on the first storage electrode and a second storage electrode on the gate insulating layer, and, wherein the first passivation layer has a storage contact hole exposing the second storage electrode, and the pixel electrode contacts the second storage electrode through the storage contact hole.

11. An array substrate for a transfiective liquid crystal display device, comprising:

a substrate a gate line and a data line on the substrate, the gate line and the data line crossing each other to define a pixel region including a transmissive area and a reflective area surrounding the transmissive area;

a thin film transistor having a gate insulating layer, the thin film transistor connected to the gate line and the data line;

a first passivation layer on the thin film transistor, the first passivation layer having a drain contact hole exposing a drain electrode of the thin film transistor and a through hole exposing the substrate in the transmissive area;

a reflective plate on the first passivation layer;

a second passivation layer on the reflective plate; and a pixel electrode on the second passivation layer, the pixel electrode contacting the substrate in the transmissive area through the through hole and contacting the drain electrode, through the drain contact hole, wherein the reflective plate is electrically connected to the drain electrode and wherein the reflective plate has a side surface exposed on a sidewall of the drain contact hole and the through hole such that the pixel electrode contacts the side surface of the reflective plate.

\* \* \* \* \*